US005656835A

United States Patent [19]
Komobuchi

[11] Patent Number: 5,656,835
[45] Date of Patent: Aug. 12, 1997

[54] SOLID STATE IMAGER AND ITS DRIVING METHOD

[75] Inventor: Hiroyoshi Komobuchi, Kyoto, Japan

[73] Assignee: Matsushita Electric Industrial Co., Ltd., Osaka, Japan

[21] Appl. No.: 69,871

[22] Filed: Jun. 1, 1993

[30] Foreign Application Priority Data

Jun. 1, 1992 [JP] Japan .................................. 4-140224

[51] Int. Cl.$^6$ .................... H01L 27/148; H01L 29/768
[52] U.S. Cl. .................... 257/232; 257/233; 257/432; 257/438; 257/603
[58] Field of Search .................... 257/186, 240, 257/432, 435, 464, 290, 292, 293, 294, 438, 440, 199, 322, 481, 492, 551, 589, 603, 232, 233

[56] References Cited

U.S. PATENT DOCUMENTS

| | | | |
|---|---|---|---|
| 4,758,734 | 7/1988 | Uchida et al. | 357/440 |
| 4,783,691 | 11/1988 | Harada | 257/440 |
| 4,912,536 | 3/1990 | Lou | 257/229 |
| 4,972,242 | 11/1990 | McIntyre | 257/438 |
| 5,118,924 | 6/1992 | Mehra et al. | 257/432 |
| 5,162,885 | 11/1992 | Hunt et al. | 257/55 |
| 5,214,272 | 5/1993 | Ueno | 257/435 |
| 5,262,661 | 11/1993 | Kuroda et al. | 257/233 |
| 5,298,771 | 3/1994 | Mantell | 257/440 |

FOREIGN PATENT DOCUMENTS

| | | | |
|---|---|---|---|
| 60-187187 | 9/1985 | Japan | 257/240 |
| 62-211967 | 9/1987 | Japan | 257/438 |
| 64-61965 | 3/1989 | Japan | 257/438 |
| 4-91473 | 3/1992 | Japan | 257/435 |

OTHER PUBLICATIONS

Donnelly et al., "Planar Guarded Avalanche Diodes in InP Fabricated by Ion Implantation", Appl. Phys. Lett., vol. 35, No. 1. Jul. 1, 1979, pp. 74-76.

*Primary Examiner*—Ngân V. Ngô
*Attorney, Agent, or Firm*—Ratner & Prestia

[57] ABSTRACT

A very high sensitive solid state imager is realized by employing a multiplication process which includes avalanche multiplication of charges as generated by an incident light at each of several optical to electrical converting components (hereafter referred to as a photosite). Thus, the functions of a high speed electron shutter are obtained. Notwithstanding a high sensitivity, a reduced supply voltage for avalanche multiplication can be realized by laminating a transparent electrode of poly-silicon or ITO on a photosite, applying an avalanche multiplication voltage thereupon through its capacity coupling, and simultaneously applying a negative voltage on a read-out gate during a readout time. Furthermore, a reduced readout voltage can also be realized by laminating a transparent electrode of poly-silicon or ITO, on a photosite, and applying a voltage of polarity opposite to that applied during an avalanche multiplication time.

21 Claims, 12 Drawing Sheets

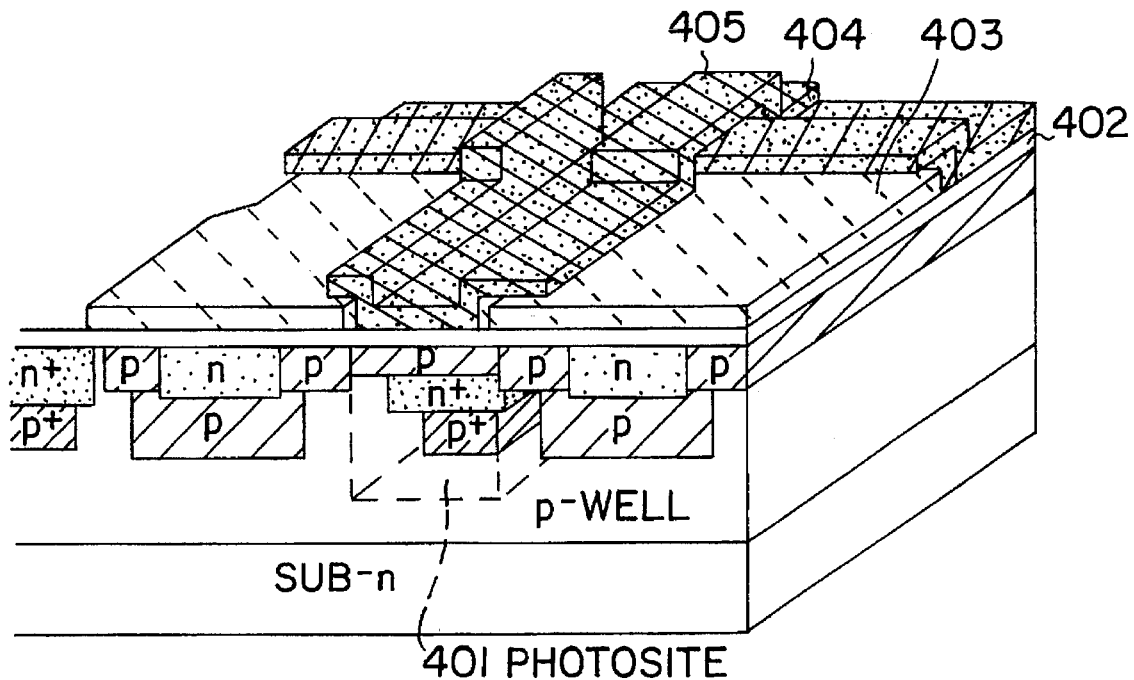
FIG. 4
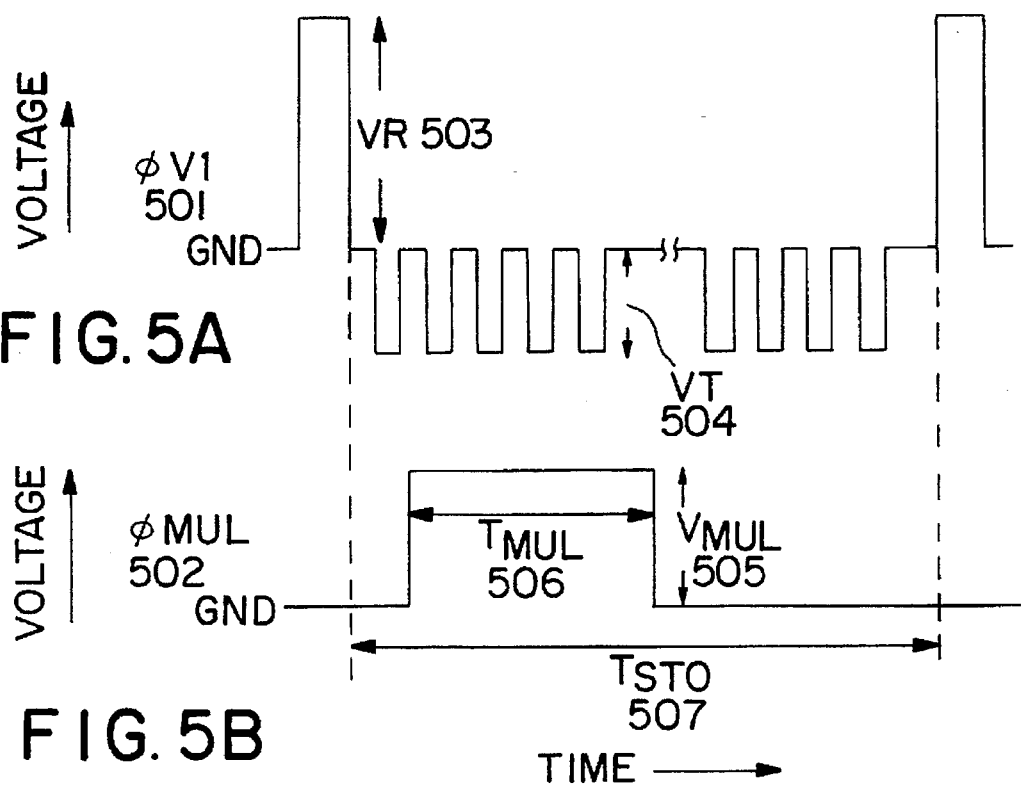
FIG. 5A
FIG. 5B

SOLID STATE IMAGER AND ITS DRIVING METHOD

BACKGROUND OF THE INVENTION

1. Field of the Invention

The present invention relates to a solid state imager, and in particular to a solid state imager characterized in that, within each pixel thereof, electric charges generated by an incident light are multiplied in avalanche multiplication mode.

2. Description of the Prior Art

For the pixel-amplification type solid state imager, wherein amplification is conducted by an amplifier adjacent to each pixel during read out time, AMI, CMD, SIT, BASIS and etc. have so far been proposed.

They have some disadvantages as follows:

1. An enhanced number of components are needed to make a pixel.

2. Because a current is read out from a pixel, a restricted read-out time results in a restricted amplification gain.

3. The sweeping-out of signal charges is not enabled in the same way as done in the current imagers in a high-speed electronic shutter mode through vertical overflow drain.

4. Primarily due to the manufacturing process, there exists inherently a fixed pattern noise caused by the fluctuation of the gate width of the amplifier.

Against the pixel-amplification type solid state imager, there are pick-up tubes wherein signal charges generated by an optical-to-electrical conversion are in situ amplified.

For a High Definition Television (HDTV)-use high sensitive pick-up tube, HARP tube was proposed which utilizes avalanche phenomena for amplification. However, the device has the following disadvantages:

5. A big reduction in size is difficult.

6. A voltage higher than 180 V is needed to drive the device.

7. The device is fragile against mechanical vibration or shock.

8. The device is apt to be distorted in images and to be easily effected by terrestrial magnetism.

Although these disadvantages are recognized, it has been confirmed that the device has a gain as high as 1000 times and that it exhibits lower noise probably stemming from avalanche multiplication run on charge-storage-mode operation.

SUMMARY OF THE INVENTION

A solid state imager employs avalanche multiplication phenomena in each pixel.

The solid state imager, according the present invention, comprises: a photo-electron conversion part (hereafter referred to as a photosite) wherein the first depletion layer is formed at the junction part between the first p-type and the first n-type semiconductor region, and electric field being applied so as to give rise to an avalanche multiplication in the first depletion layer, and wherein the second semiconductor region which is doped with lower impurity density of the same or the opposite type conductivity which surrounds the first p-type and the first n-type semiconductor region, in such a way that a maximum electric field is kept below an avalanche multiplication field strength in the second depletion layer formed in the second semiconductor region; and a means for reading out signal charges injected into the first depletion layer by avalanche multiplication.

The solid state imager, according to the present invention, utilizes the pixel structure of avalanche multiplication enabling high integration, and multiplies in situ signal charges generated by an incident light during the storage time. Thus multiplication gain is independent of read out time. As the region of avalanche multiplication is confined to a part of the photosite, a high-speed electronic shutter operation through vertical overflow drain which is characteristic to conventional CCD solid state imagers can be realized.

Furthermore, a transparent or a semi-transparent electrode of indium tin oxide (ITO), poly-silicon or other materials is deposited above the photosite with an insulator film as an intermediate material. Thus, avalanche voltage in the first depletion layer is given during charge multiplication time by means of capacitance coupling (via the transparent or semi-transparent electrode) in addition to a depletion layer voltage which is supplied through the channel below the readout gate during readout time, thus resulting in reduced supply voltages.

BRIEF DESCRIPTION OF THE DRAWINGS

FIG. 4 is a figure illustrating a second exemplary embodiment of the present invention showing a bird's-eye view of a MOS-avalanche multiplication type pixel.

FIG. 5 is a figure representing driving pulse patterns for the MOS-avalanche multiplication type pixel.

DESCRIPTION OF THE PREFERRED EMBODIMENTS

Figure 1A:
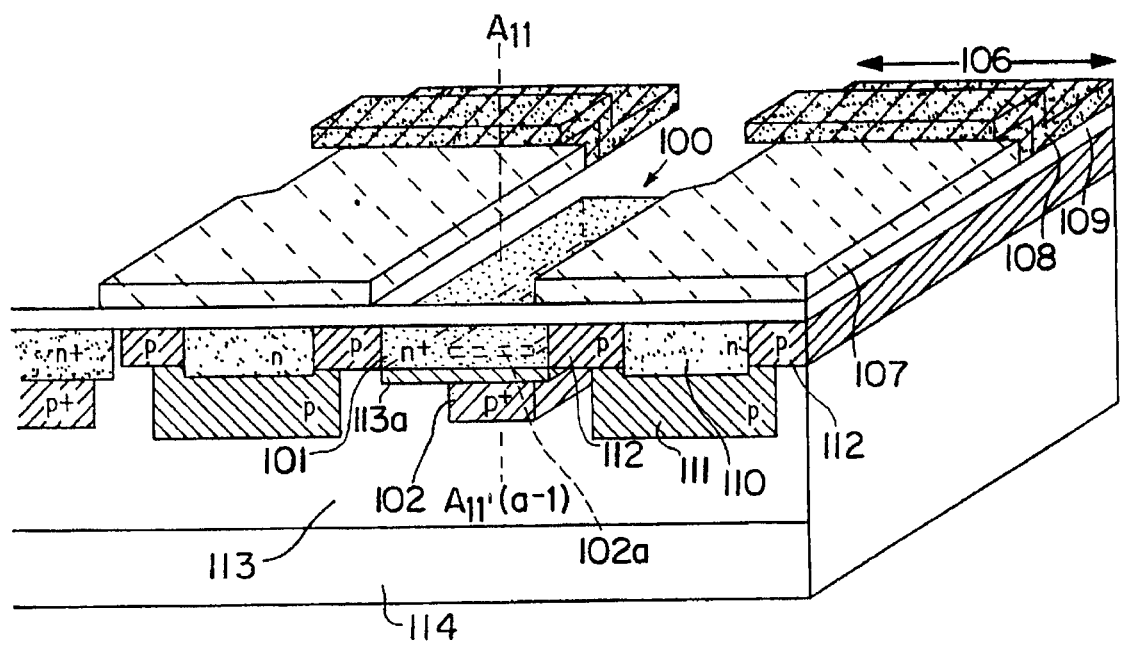
FIG. 1 is a figure illustrating a first exemplary embodiment of the present invention, showing a bird's eye view of an avalanche multiplication type pixel which constitutes a solid state imager.
Figure 1B:
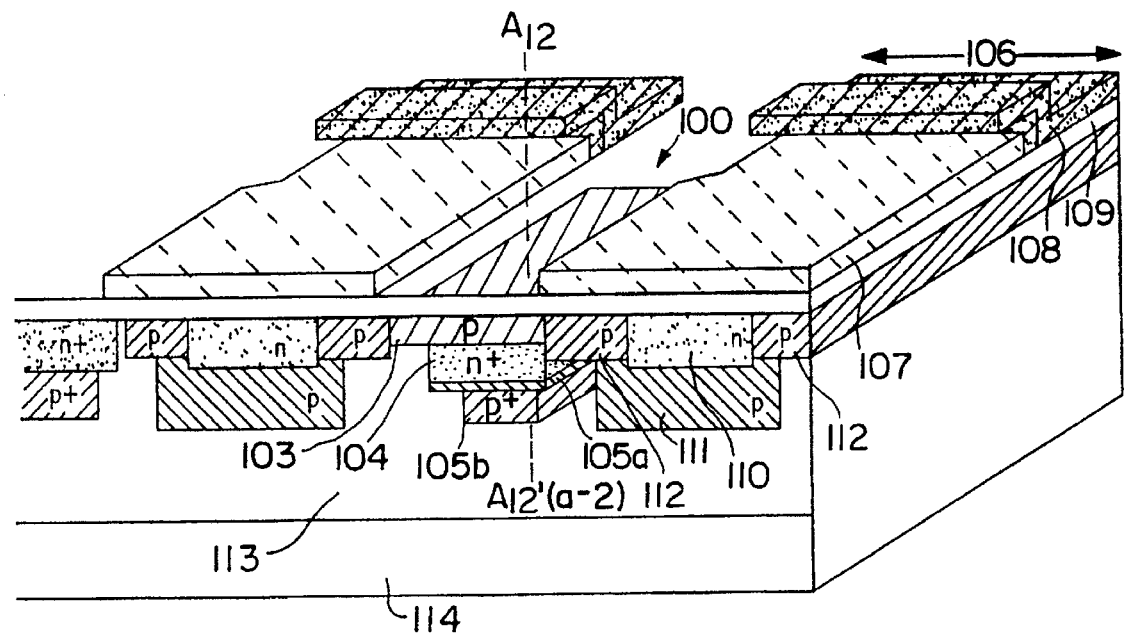

FIG. 1 illustrates a first exemplary embodiment of the present invention, showing the basic structure of two types of photosite 100 in an avalanche multiplication type solid state imager.

One type of photosite (a-1) comprises an n+ layer 101 and a p+ layer 102, while the other type (a-2) comprises from the surface into the bulk a p layer 103, an n+ layer 104 and p+ layers 105a and 105b. A detailed explanation about an avalanche multiplication part will be given with regard to the photosite (a-2).

Avalanche multiplication takes place at a junction formed by n+ layer 101 and p+ layer 102. A first depletion layer 102a is formed at the junction between the n+ layer 101 and the p+ layer 102. Because n+ layer 101 is larger in area than p+ layer 102, the outside part of n+ layer 101 makes another junction with a p well layer 113 which is lower in impurity density than p+ layer 102. A second depletion layer 113a is formed at the junction between the n+ layer 101 and the p-well layer 113. Thus spaces of electric equipotential lines around the outside part are larger than those around the inside part. This prevents a concentration of electric field at the outside edge and evades an edge breakdown.

FIG. 1 also shows a bird's-eye view of the solid state imager, showing a means for reading out besides the photosite. A vertical CCD (V-CCD) part 106 for transferring signal charges comprises a first poly-silicon layer 107, a second poly-silicon layer 108, an oxide film 109, a transfer channel n layer 110, a transfer channel p layer 111, a channel stopper p layer 112, a p-well layer 113, and a substrate n layer 114.

CCD state of the art devices are used to ensure decreased driving voltage. When operating the high speed electronic shutter function, a value of a driving voltage applied on n-substrate depends on the intermediate p-well impurity concentration which determines the height of the potential barrier for electron. Unfortunately, the proposed p+-well for building an avalanche region makes a higher potential barrier for electrons and requires an increase of the driving voltage which is applied on the n-substrate during the high speed electronic shutter operation. To deal with both the avalanche multiplication function and the high speed electronic shutter function at low supply voltages, both areas of the p-well and the p+-well are desirably separated in a photosite.

Figure 2:
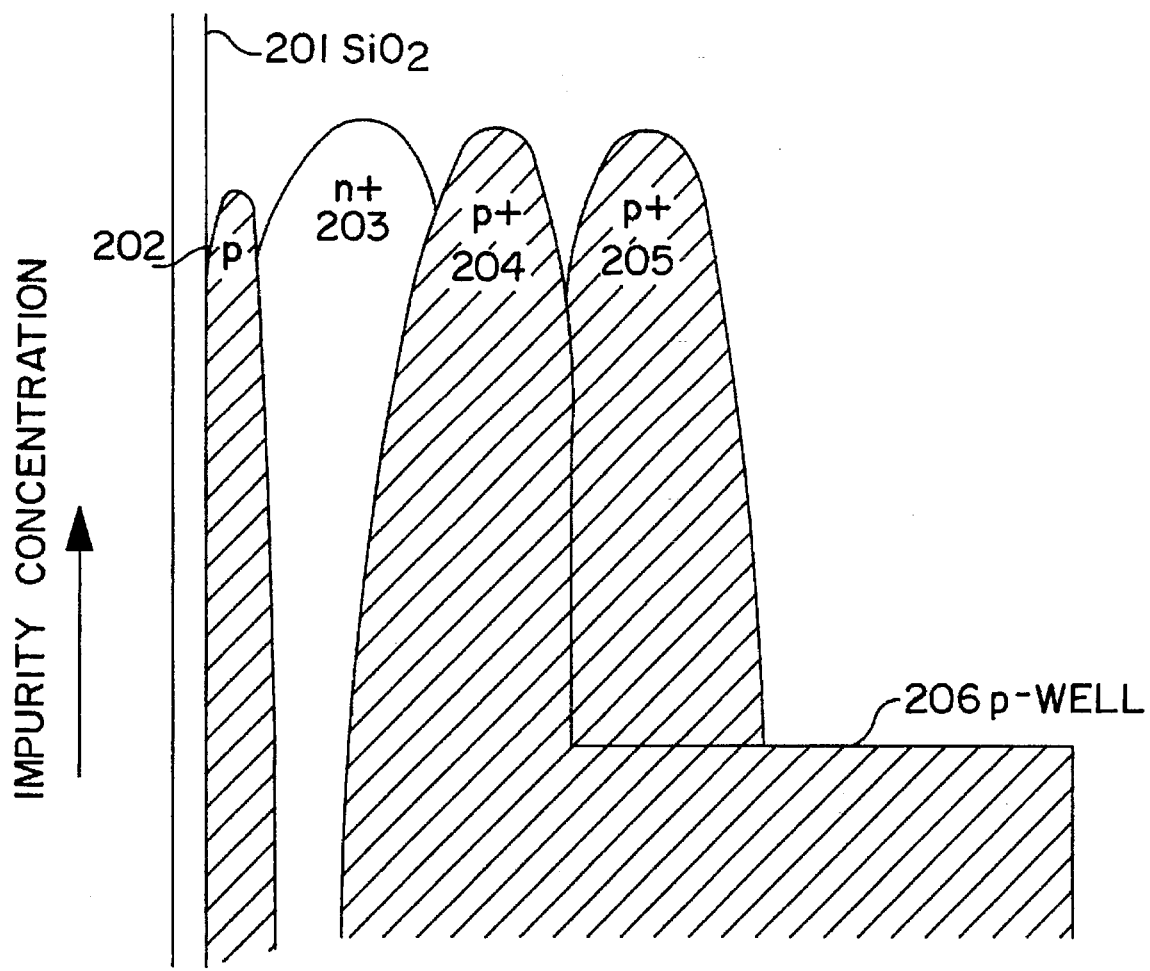
FIG. 2 is a figure representing the impurity density profile of the avalanche multiplication type pixel.

FIG. 2 is a figure representing the impurity density profile from the surface into the substrate along a line A12 to A12' shown in FIG. 1 (a-2). The profile denotes from the surface an oxide film 201, a p layer 202, an n+ layer 203, the first p+ layer 204, the second p+ layer 205 and a p-well layer 206. In order to give rise to avalanche multiplication at voltages of less than 40 V and to evade tunneling, it is appropriate to ion implant impurity atoms, in such a way that the maximum impurity densities of the n+ layer 203 and the p+ layer 204 are more than $10^{17}$ cm$^{-3}$ and less than $10^{18}$ cm$^{-3}$ and that the distance between the positions pointing peak values is less than 1 μm.

Furthermore, in order to prevent the diffusion of the impurity concentration profile, every process step after ion implantation is carried out at a temperature of less than 1000 degree centigrade, thereby ensuring a steep impurity profile between the n+ layer 203 and the second p+ layer 204.

Because the projected straggle, or longitudinal spread of ion-implanted impurity distribution of phosphorus which forms the n+ layer 203 is larger than that of boron which forms p+ layer 204, (S. M. Sze, Physics of Semiconductor Devices, 2nd Edition, pp 70, 1981, McGraw Hill Book Co. hereby incorporated by reference) there would appear a part of n+ layer 203 between the first p+ layer 204 and p-well layer 206, so that electric field intensity in the junction between the n+ layer 203 and the first p+ layer 204 would become insufficient for avalanche multiplication at an applied voltage of less than 40 V. The second p+ layer 205 is ion implanted so as to delete the n+ layer which might appear between the p+ layer 204 and p-well layer 206. Accordingly, the second p+ layer is ion implanted more than once.

Figure 3:
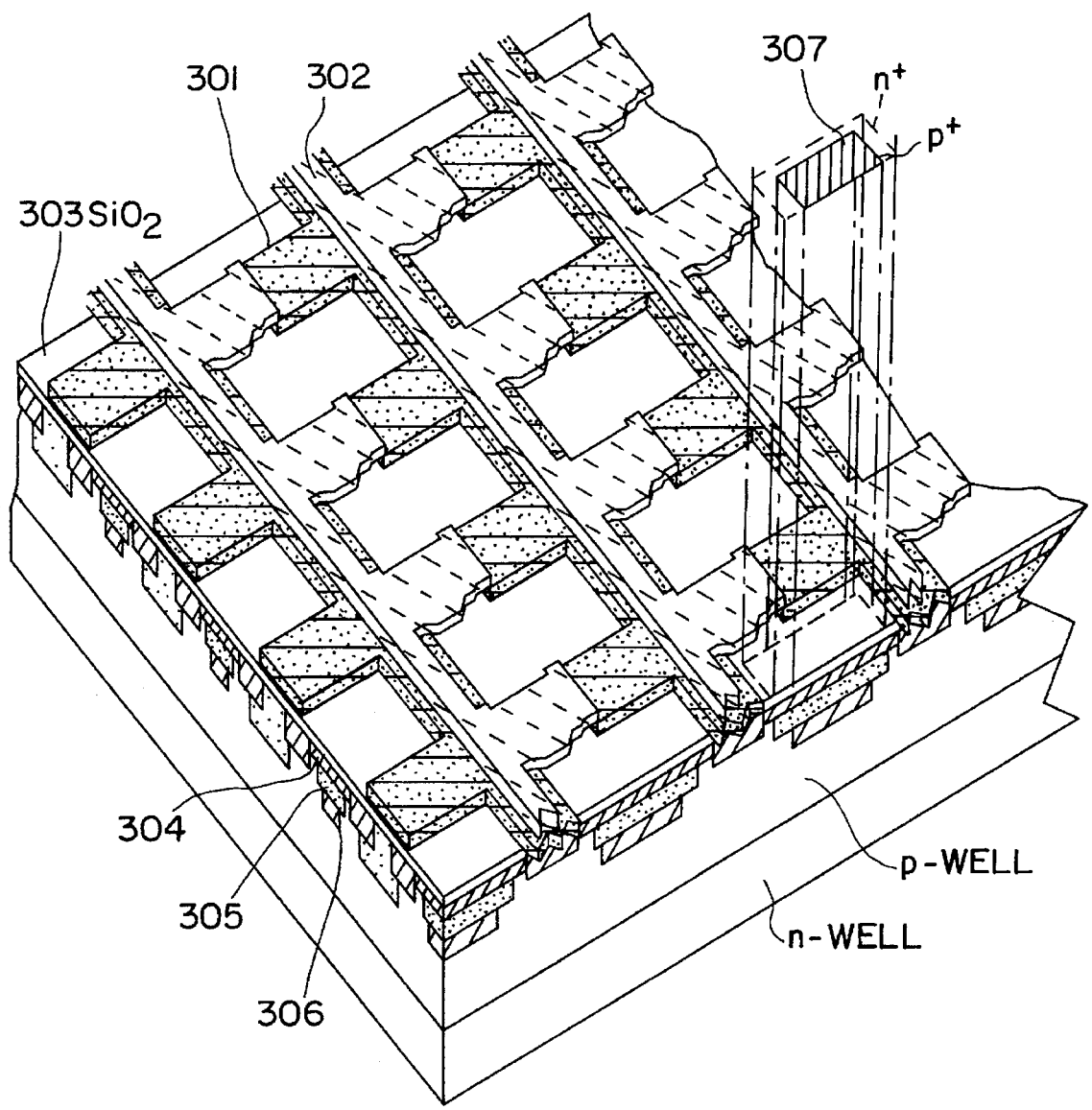
FIG. 3 is the bird's-eye view of the avalanche multiplication type solid state imager.

FIG. 3 is a bird's-eye view of the solid state imager, having the V-CCD for transferring signal charges and the avalanche multiplication type photosite. The V-CCD consists of the first poly-silicon electrode 301 and the second poly-silicon electrode 302, while the photosite consists of the p layer 304, the n+ layer 305 and the p+ layer 306, avalanche multiplication taking place at the junction plane 307 formed between the n+ layer 305 and p+ layer 306.

FIG. 4 illustrates a second exemplary embodiment of the present invention, showing a bird's-eye view of a MOS-avalanche multiplication type pixel, having the third transparent electrode 405 of poly-silicon or ITO deposited on the photosite. The third electrode 405 is deposited on the photosite with the oxide film 402 as an intermediate material.

FIG. 5 shows a driving voltage pulse pattern $\phi_{V1}$ 501 applied on the first poly-silicon electrode 403 so as to read out signal charges, and another driving voltage pulse pattern $\phi_{MUL}$ 502 applied on the third electrode 405. The driving voltage pulse pattern $\phi_{V1}$ 501 is the same as that applied on the read-out electrode of the conventional CCD type solid state imager. A multiplication time $T_{MUL}$ 506 during which a voltage $V_{MUL}$ 505 is being applied is set within an storage time $T_{STO}$ 507. The average multiplication gain $G_{AVE}$ during the storage time $T_{STO}$ 507 is given by the formula (1):

$$G_{AVE} = \frac{\int_0^{T_{MUL}} n_p(t) G(t) dt + \int_{T_{MUL}}^{T_{STO}} n_p(t) dt}{\int_0^{T_{STO}} n_p(t) dt} \qquad \text{Formula (1)}$$

where $n_p(t)$ is signal charges generated by optical-to-electrical conversion per unit area per unit time, and G(+) is a function of the voltage $V_{MUL}$ 505, and is approximately given by the formula (2):

$$G(t) = \frac{1}{1 - (V_{MUL}/V_B)^n} \qquad \text{Formula (2)}$$

where $V_B$ is a breakdown voltage, and n is a parameter depending on the impurity density profile at the junction. (S. L. Miller: Phys. Rev. Vol. 99, No. 415, pp 1234–1240, 1955 hereby incorporated by reference). However, the true situation is that G(+) is a non-linear function of applied voltage $V_{MUL}$ 505, that is, G(+) does not increase uniformly with the increase of applied voltage $V_{MUL}$ 505 as the formula (2) expresses, and that, furthermore, G(+) depends on the density of stored signal charges. Therefore it is difficult to control multiplication gain by varying voltage value.

According to an exemplary embodiment of the present invention, the average avalanche gain $G_{AVE}$ can be linearly and accurately controlled by varying the period of multiplication time $T_{MUL}$ 502. This method is well tuned to a pulse width modulation circuit, thereby resulting in design easiness.

Figure 6:
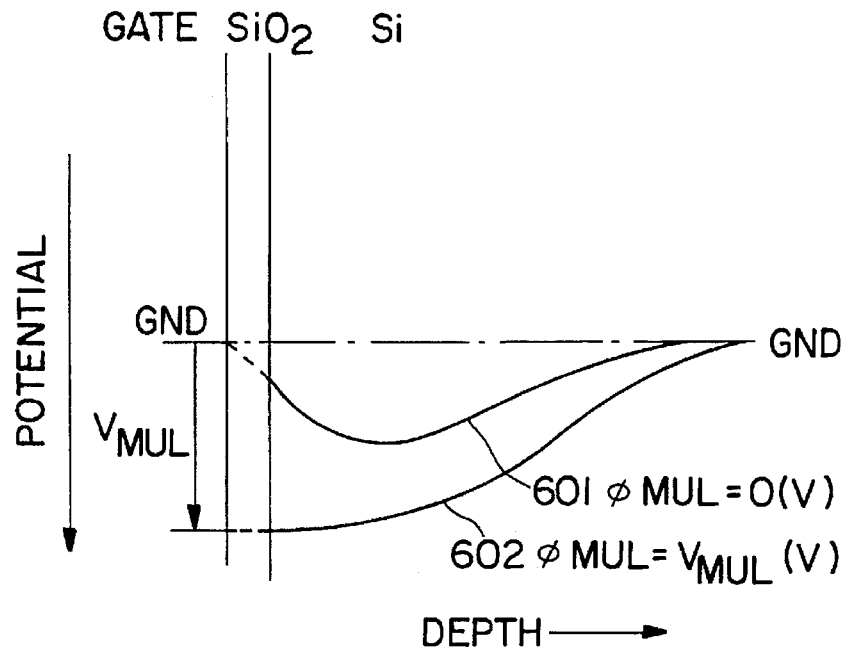
FIG. 6 is a figure representing a potential profile in the MOS-avalanche multiplication type pixel.

FIG. 6 is a figure representing electric potential profiles along a line A11 to A11' shown in FIG. 1, one potential profile 601 being for the state that the voltage $\phi_{MUL}$ 502 applied on the third poly-silicon electrode 405 is zero, and the other 602 for the state that the voltage $\phi_{MUL}$ 502 is $V_{MUL}$ 505.

Figure 7:
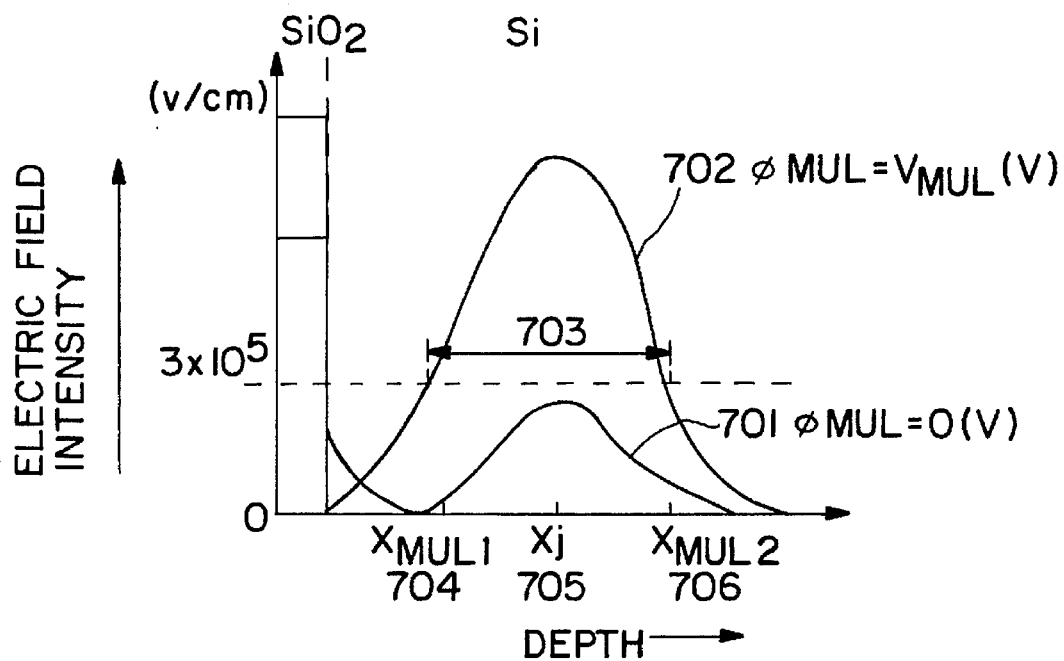
FIG. 7 is a figure representing an electric field intensity profile corresponding to FIG. 6.

FIG. 7 is a figure representing electric field intensity profile corresponding to FIG. 6. During the latter state ($\phi_{MUL}=V_{MUL}$), signal charges generated by the optical-to-electrical conversion of an incident light within the region extending to the diffusion length from the edge of the depletion layer are avalanche-multiplied during their transit through the avalanche multiplication region 703, wherein electric field intensity exceeds $3\times10^5$ V/CM, electric field intensity being maximum at the junction depth Xj 705. In the potential profile 602 of FIG. 6, avalanche multiplied signal charges are thus stored in the portion of the highest potential in the neighborhood of the interface $SiO_2$—Si.

During the former state ($\phi_{MUL}=0$), electric field intensity within the avalanche multiplication region 703 is below $3\times10^5$ V/CM, therefore signal charges generated by the optical-to-electrical conversion of an incident light within the region extending to the diffusion length from the edge of the depletion layer transit through said region 703 without avalanche multiplication, and are stored in the lower port of the potential well.

Figure 8A:
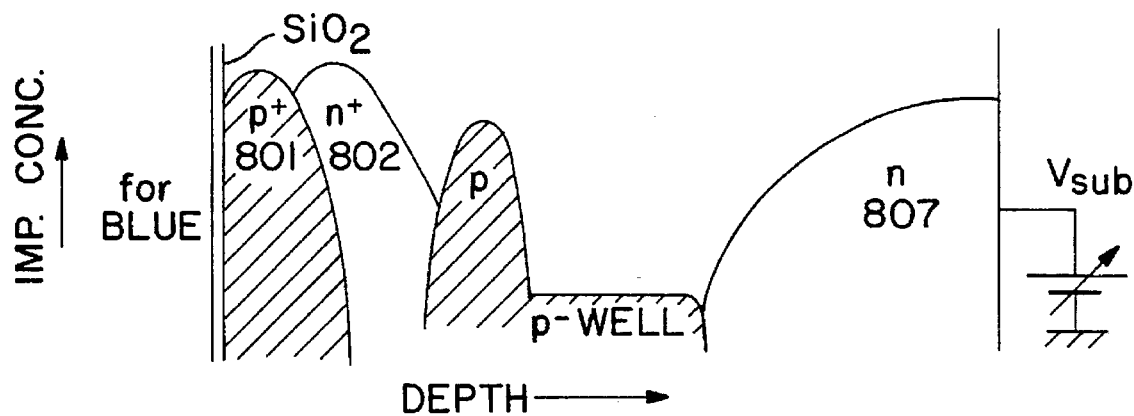
FIGS. 8(a)–8(c) is a figure illustrating a third exemplary embodiment of the present invention, representing an impurity density profile of a frequency-selective MOS-avalanche multiplication type pixel.
Figure 8B:
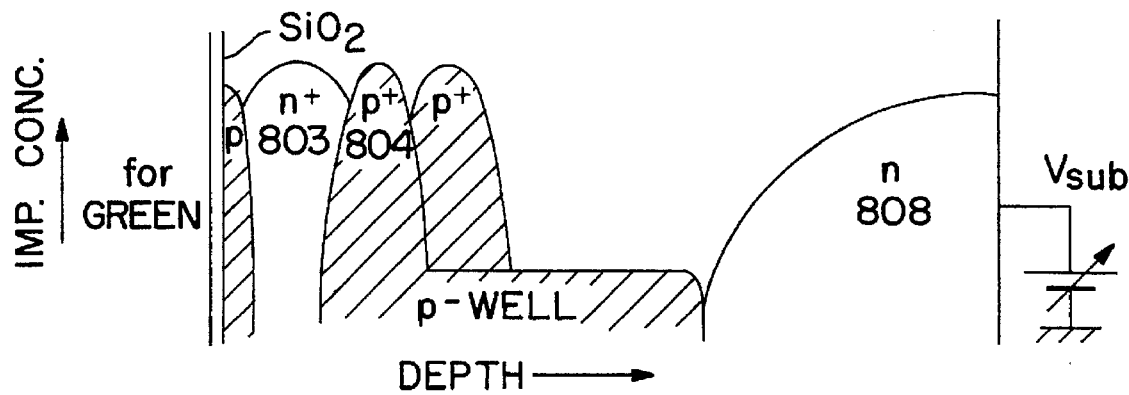
Figure 8C:
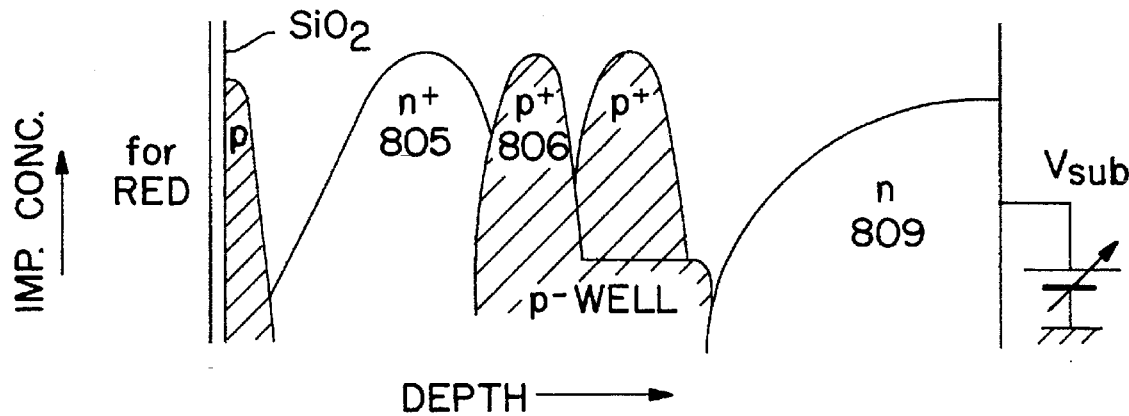

FIG. 8 shows a third exemplary embodiment of the present invention, wherein an impurity density profile (a), (b) and (c) being shaped in such a way that the position of the avalanche multiplication region is tuned to the absorption coefficient of blue, green, and red light, respectively. In the case of the profile (a), the junction part, which is formed by a p+ layer 801 and an n+ layer 802, and at which avalanche multiplication occurs, is disposed in such a way that avalanche multiplication occurs selectively for a wave length carrying blue information.

In the case of the profile (b), the junction part, which is formed by a n+ layer 803 and an p+ layer 804, and at which avalanche multiplication occurs, is disposed in such a way that avalanche multiplication occurs selectively for a wave length carrying green information.

In the case of the profile (c), the junction part, which is formed by a n+ layer 805 and an p+ layer 806, and at which avalanche multiplication occurs, is disposed in such a way that avalanche multiplication occurs selectively for a wave length carrying red information.

Thus, with the solid state imager of the present invention, it would be possible to make avalanche multiplication occur selectively for each color component of light, with a reduced number of or a reduced thickness of laminated color filters, or without color filters at all. This would be advantageous in terms of planarisation of the surface of the solid state imager.

In a modification of this embodiment, n+ layers and p+ layers can be repeatedly formed to the depth direction, thereby making a multi-state avalanche multiplication region in a photosite, and realizing avalanche multiplication for each of different wave lengths of light incident on said photosite.

Figure 9:
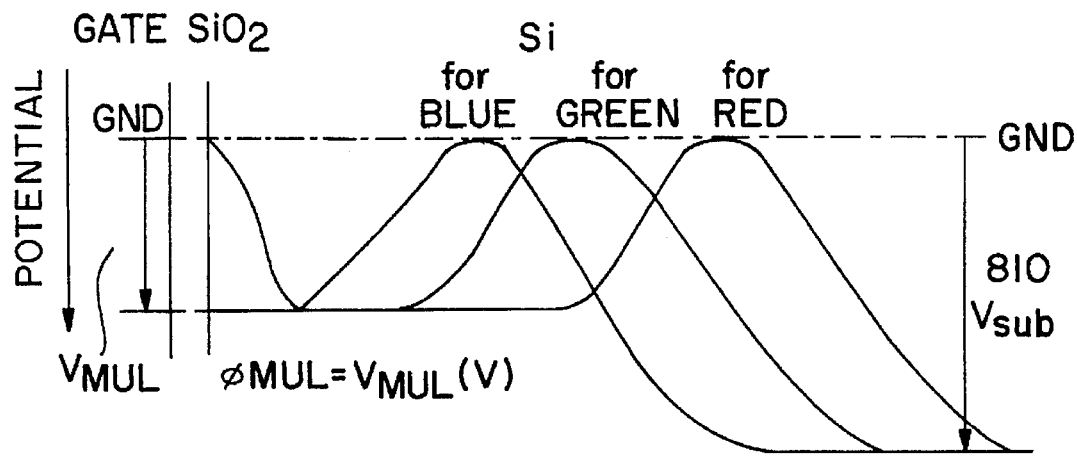
FIG. 9 is a figure representing a potential profile corresponding to FIG. 8.

By appling a substrate voltage $V_{SUB}$ 810 as shown in FIG. 9, an irrelevant color signal charges can be flown out towards the substrate in advance during multiplication, thereby enabling a high sensitive detection of each color information, red, green or blue.

Figure 10:
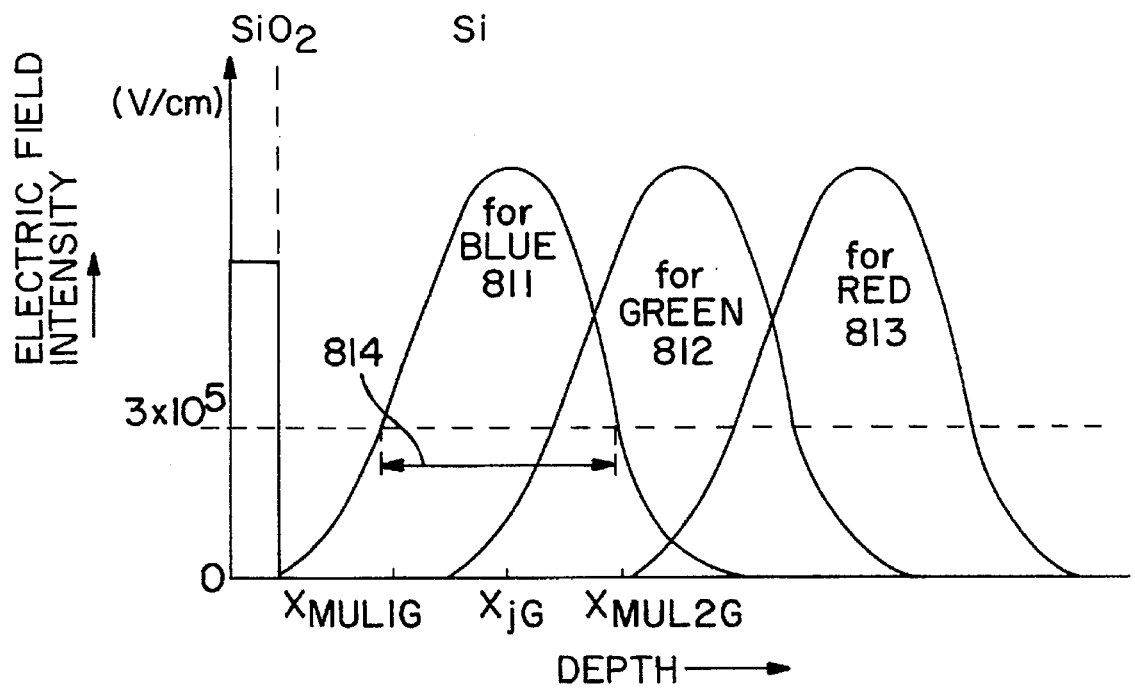
FIG. 10 is a figure representing an electric field intensity profile corresponding to FIG. 8.

FIG. 10 shows electric field intensity profiles for blue 811, green 812 and red 813, each avalanche multiplication region being tuned to the wave length characteristic of blue, green and red, respectively.

Figure 11:
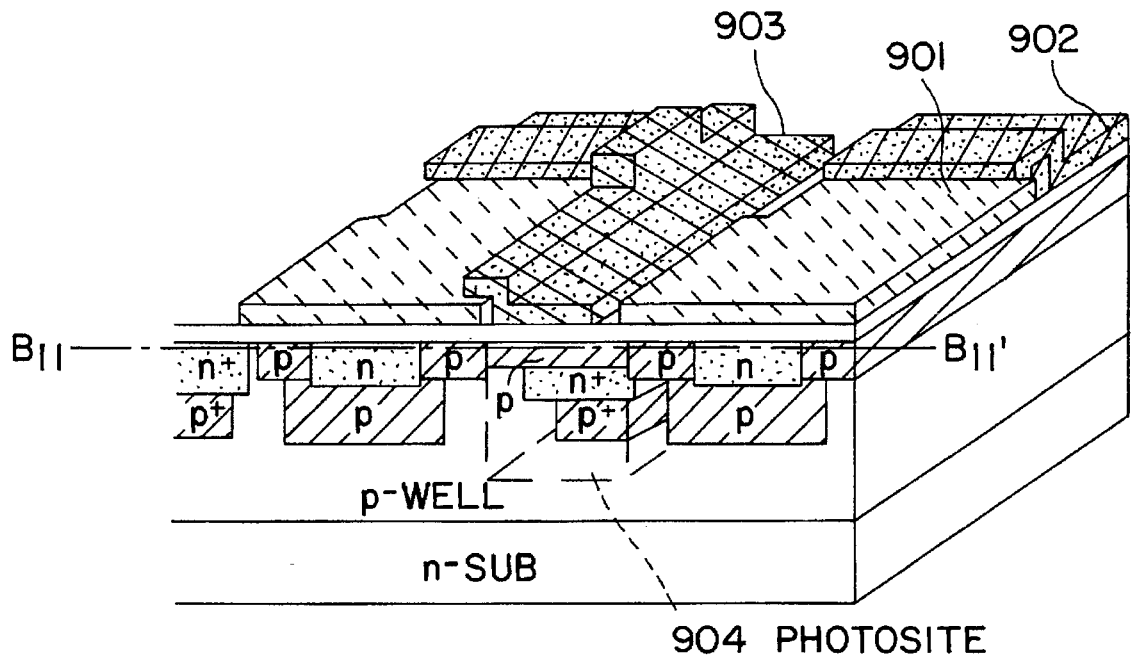
FIG. 11 is a figure illustrating a fourth exemplary embodiment of the present invention, showing a bird's-eye view of another MOS-avalanche multiplication type pixel.

FIG. 11 shows a fourth exemplary embodiment of the present invention, showing the bird's-eye view of another MOS-avalanche multiplication type pixel, with a third poly-silicon electrode 903 which has a gap, or evades overlapping from a first poly-silicon electrode 901 and a second poly-silicon electrode 902.

Figure 12A:
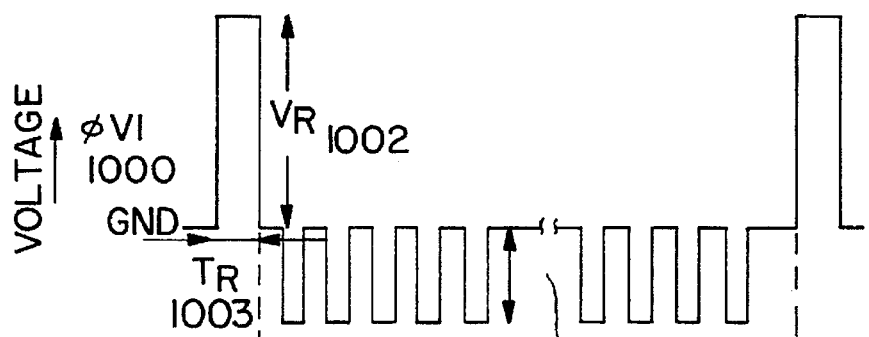
FIG. 12 is driving pulse patterns for the MOS-avalanche multiplication type pixel.
Figure 12B:
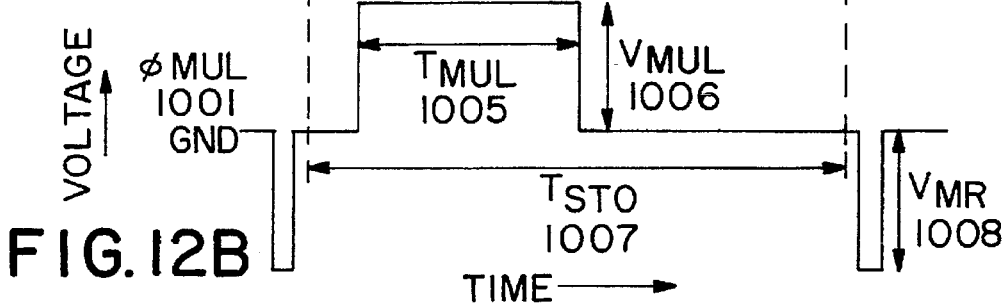

FIG. 12 shows driving pulse pattern; one $\phi$ V1 1000 for the first poly-silicon electrode, or read-out electrode 901, the other $\phi$ MUL 1001 for a third transparent electrode of poly-silicon or ITO 903. The driving pulse pattern $\phi_{V1}$ 1000 is the same as applied on the read-out electrode of the conventional CCD type solid state imager. A multiplication time $T_{MUL}$ 1005 during which a multiplication voltage VMUL 1006 is being applied is to be set up inside an storage time $T_{STO}$ 1007, while during a read-out time $T_R$ 1003, a negative voltage $V_{MR}$ 1008 is applied on the third transparent electrode of poly-silicon or ITO 903.

Figure 13:
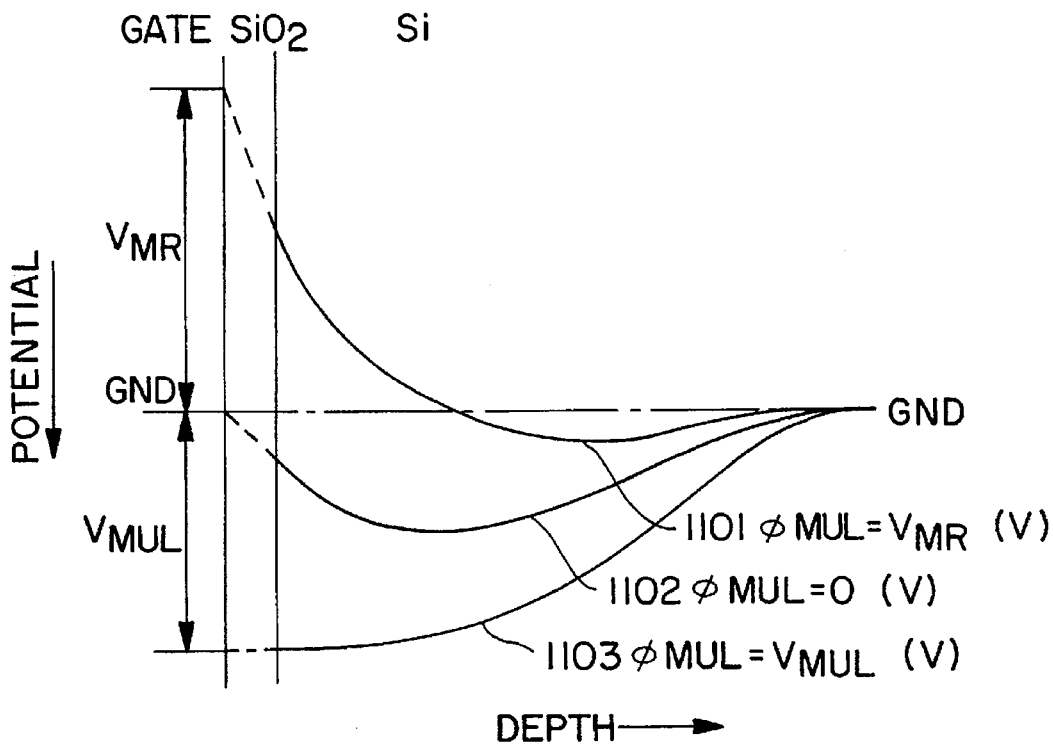
FIG. 13 shows a potential profile of the MOS-avalanche multiplication type pixel.

FIG. 13 shows potential profiles towards the substrate along a line A11 to A11' as shown in FIG. 1. The three potential profiles 1101, 1102 and 1103 correspond to multiplication time 1005, storage time after multiplication (roughly 1007 minus 1005), and readout time (inside 1003), respectively, as shown below in FIG. 12. A potential profile at O MUL=$V_{MR}$ 1101 results in reducing the read-out voltage $V_R$ 1002 which is applied on the first poly-silicon electrode 901.

Figure 14:
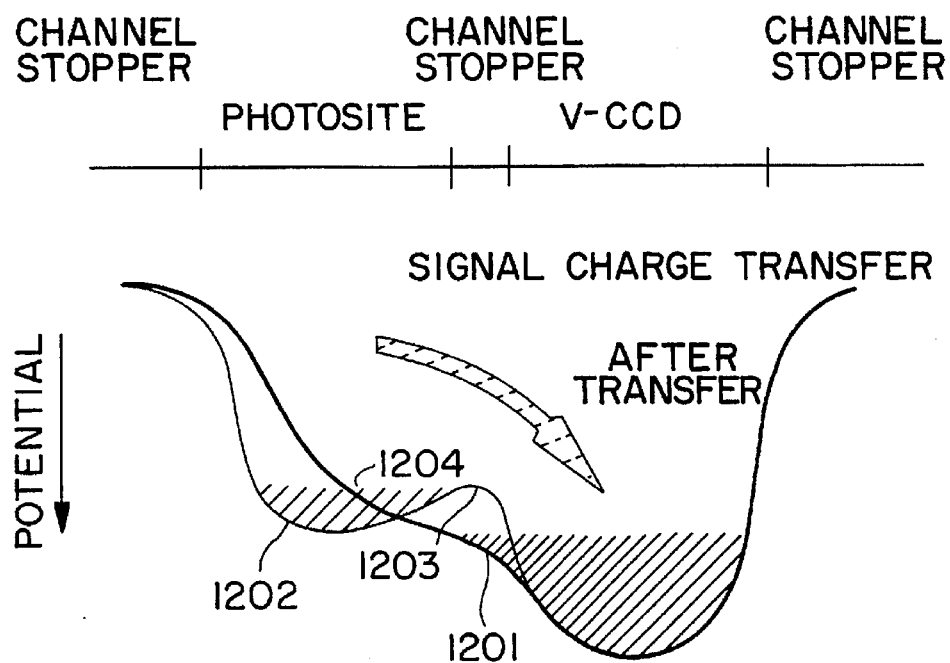
FIG. 14 is a figure showing the transfer of signal charges.

FIG. 14 shows a potential profile along a line B11 to B11' shown in FIG. 11 connecting the portions of minimum potential, or the potential wells beneath the $SiO_2$—Si interface, a broad line 1201 corresponding to the embodiment of the present invention, and a fine line 1202 corresponding to the conventional solid state imager.

In the conventional solid state imager, due to a potential barrier 1203, there exists a remaining charges 1204 even after read-out, while in exemplary embodiments of the present invention, remaining charges vanish because the potential barrier 1203 disappears, stemming from the above-described proposal that the third transparent poly-silicon electrode has a gap, or evades overlapping from the first poly-silicon electrode 901, and the second poly-silicon electrode 902.

Alternatively a p+ layer 102 or 105 which defines the avalanche multiplication region is disposed apart from a first poly-silicon electrode or a read-out gate 403, thereby forming a potential profile which uniformly increases towards the read-out gate, and resulting in diminishing remaining charges after transfer, or an afterimage.

Figure 15A:
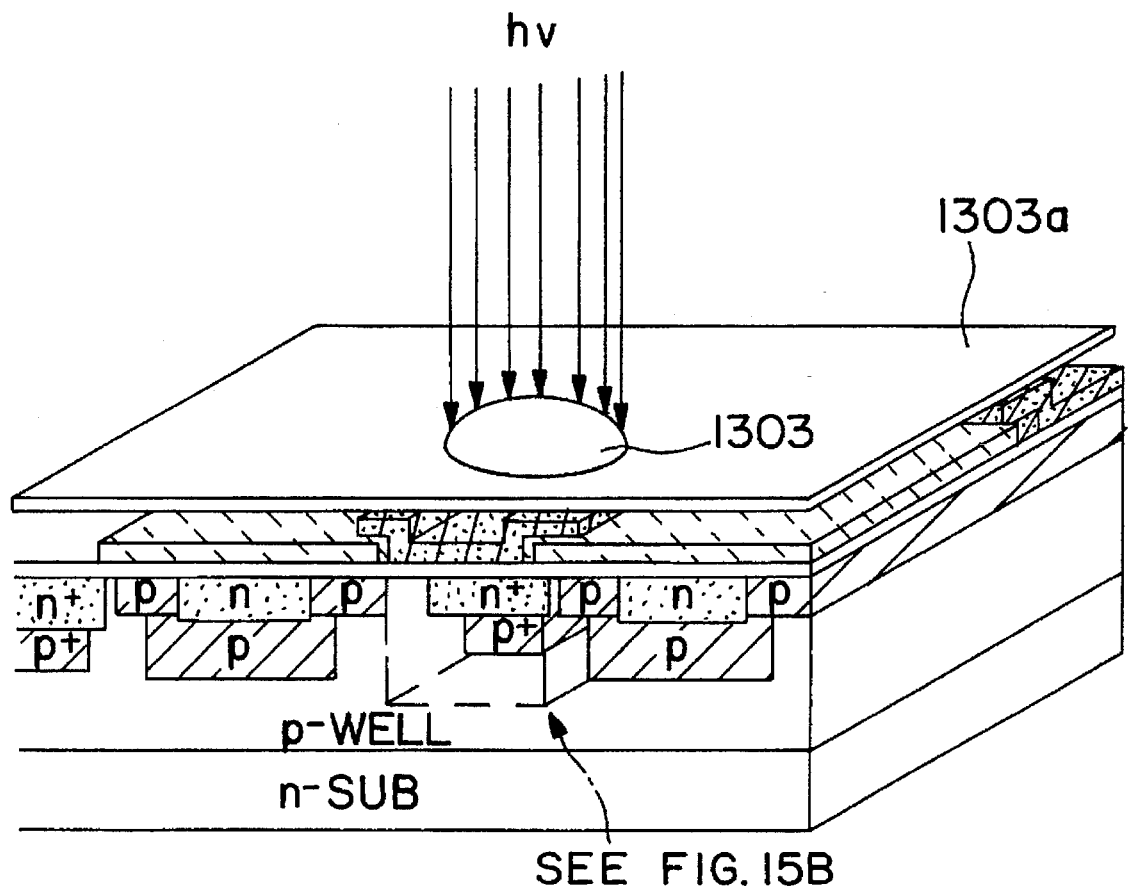
FIG. 15 is a figure illustrating a fifth exemplary embodiment of the present invention, showing another avalanche multiplication type pixel having an on-chip lens.
Figure 15B:
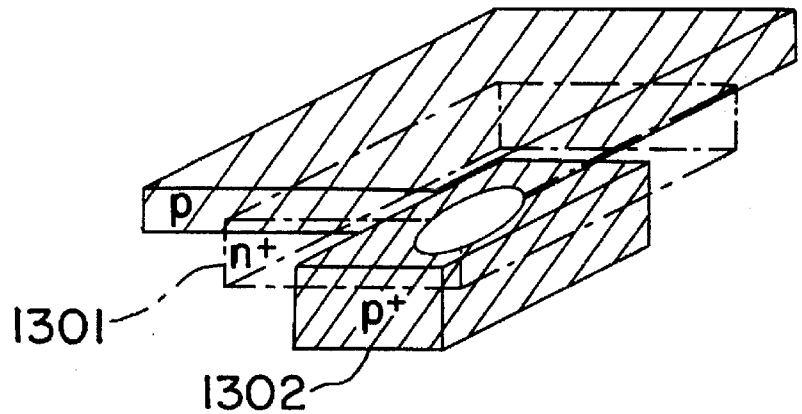

FIG. 15 shows a fifth exemplary embodiment of the present invention, showing another avalanche multiplication type pixel, having a transparent convex resin 1301 laminated above a photosite. The concave transparent resin 1303 is placed above an opening provided in a light screen material 1303a over the photosite so that incident light through the concave transparent resin is collected in a first junction plane of the photosite. A light incident on the convex transparent resin focuses on the avalanche multiplication region.

Figure 16:
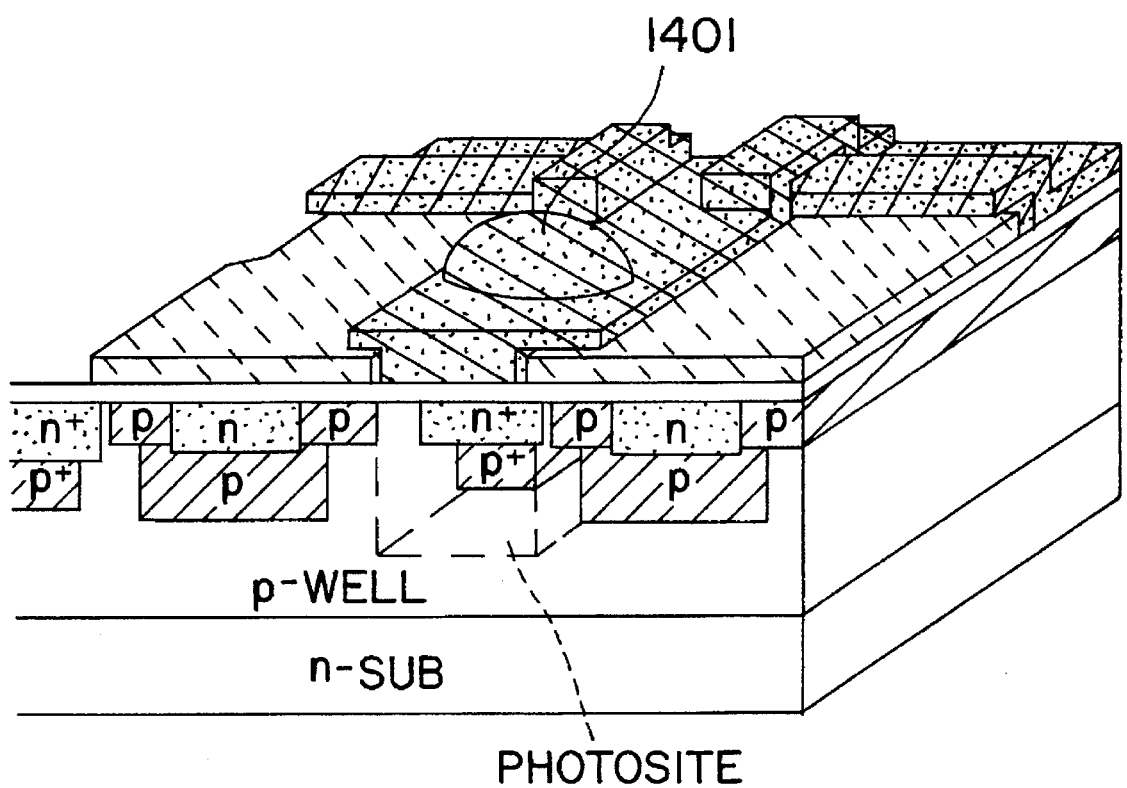
FIG. 16 is a figure illustrating a sixth exemplary embodiment of the present invention, showing still another avalanche multiplication type pixel with a transparent electrode of on-chip lens shape.

FIG. 16 is the sixth embodiment of the present invention, showing still another avalanche multiplication type pixel, wherein a convex portion of a transparent electrode 1401 is utilized as an on-chip lens.

Figure 17:
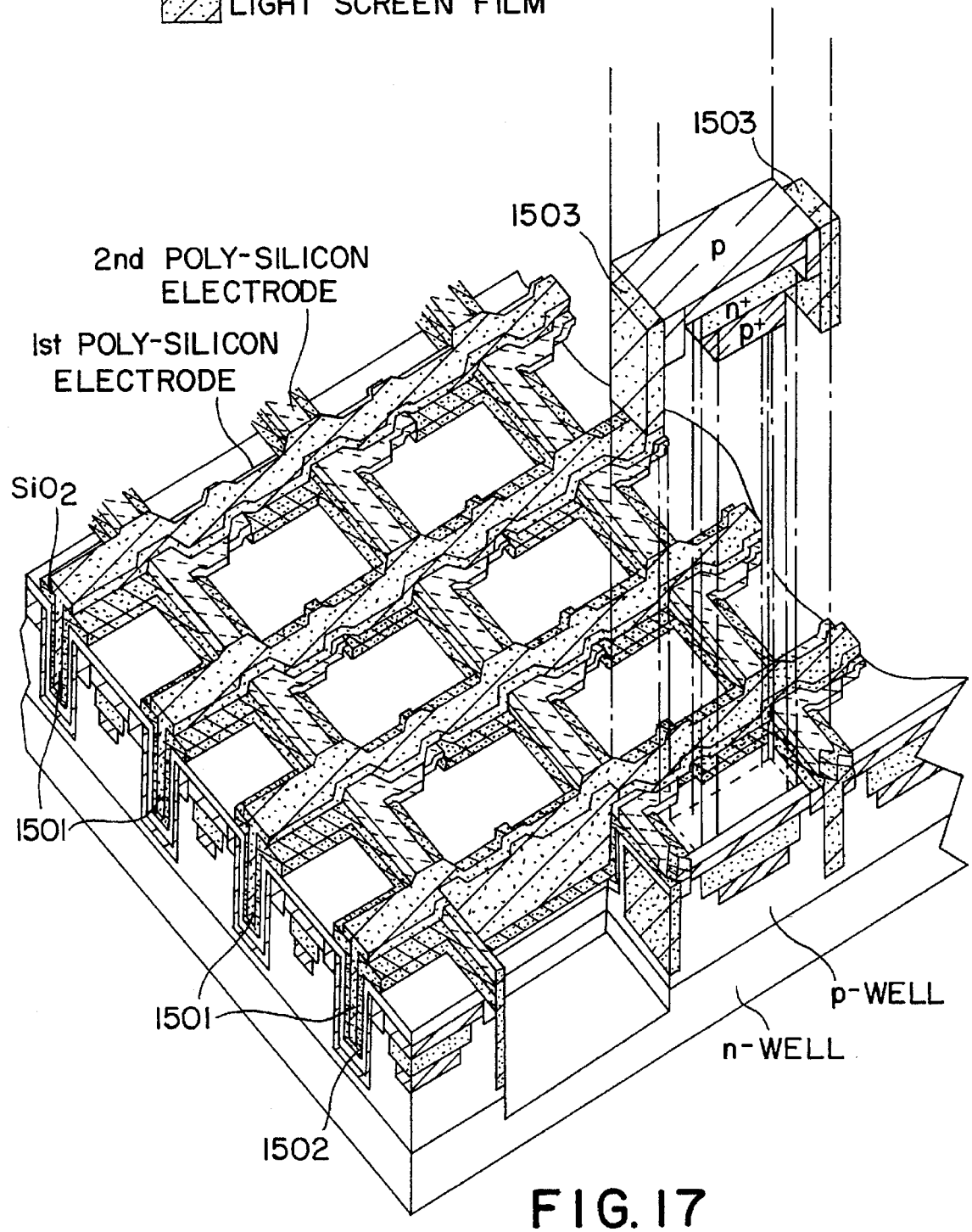
FIG. 17 is a figure illustrating a seventh exemplary embodiment of the present invention, showing still another avalanche multiplication type pixel wherein a photosite is enclosed by a trench type optical screen.

FIG. 17 is the seventh embodiment of the present invention, wherein a photosite is enclosed by a light screen material 1503. When a n multiplication gain is increased as high as $10^3$ to $10^4$, an Auger emission of light during avalanche multiplication causes light cross-talk between neighboring photosites, this effect having to be prevented by the light screen material.

As shown in FIG. 17, it is possible to dispose a means of transferring charges 1502 at more than one side planes of trenches imbedded with a light screen material. The means for transferring charges can be a conducting material.

What is claimed:

1. A solid state imager for reading out charges comprising:
   a photosite, including
   a first semiconductor layer having a first conductivity type;
   a second semiconductor layer having a second conductivity type with a first impurity density, said second semiconductor layer having a smaller area than said first semiconductor layer, said first conductivity type is the opposite conductivity type of said second conductivity type;
   a junction formed between said first semiconductor layer and said second semiconductor layer;
   a first depletion layer formed at the junction;
   means for exerting a first electric field strength so as to make a first avalanche multiplication occur in said first depletion layer;
   a third semiconductor layer having a third conductivity type which is the same conductivity type as the second conductivity type, said third conductivity having a second impurity density which is lower than the first impurity density of said second semiconductor layer surrounding a peripheral area outside of said junction,
   a second depletion layer formed between said first and third semiconductor layers and
   means for exerting a second electric field strength in said second depletion layer which is set below a field strength which causes a second avalanche multiplication in said second depletion layer,
   wherein said photosite has an incident side disposed above said semiconductor layers and wherein when an isolating film is formed on the incident side of said photosite, one of a transparent electrode and a poly-silicon electrode is laminated on said isolating film, and a voltage is applied to one of said transparent electrode and said poly-silicon electrode, the first electric field strength for the first avalanche multiplication in the first depletion layer of said photosite is controlled.

2. A solid state imager for reading out charges comprising:
   a photosite, including
   a first semiconductor layer having a first conductivity type;
   a second semiconductor layer having a second conductivity type with a first impurity density, said second semiconductor layer having a smaller area than said first semiconductor layer, said first conductivity type is the opposite conductivity type of said second conductivity type;
   a junction formed between said first semiconductor layer and said second semiconductor layer;
   a first depletion layer formed at the junction;
   means for exerting a first electric field strength so as to make a first avalanche multiplication occur in said first depletion layer;
   a third semiconductor layer having a third conductivity type which is the same conductivity type as the second conductivity type, said third conductivity having a second impurity density which is lower than the first impurity density of said second semiconductor layer surrounding a peripheral area outside of said junction,
   a second depletion layer formed between said first and third semiconductor layers and
   means for exerting a second electric field strength in said second depletion layer which is set below a field strength which causes a second avalanche multiplication in said second depletion layer,
   wherein an impurity profile is formed in at least one of said semiconductor layers, said impurity profile is shaped so that an avalanche multiplication region in the first depletion layer is formed at a depth in said photosite so that the first avalanche multiplication in the first depletion layer occurs selectively for a particular single color.

3. A solid state imager as described in claim 1, wherein an impurity profile is shaped so that an avalanche multiplication region in the first depletion layer is formed at a depth in said photosite so that the first avalanche multiplication in the first depletion region occurs selectively for a particular light frequency.

4. A solid state imager for reading out charges comprising:
   a plurality of photosites, each photosite including
   a first semiconductor layer having a first conductivity type;
   a second semiconductor layer having a second conductivity type with a first impurity density, said second semiconductor layer having a smaller area than said first semiconductor layer, said first conductivity type is the opposite conductivity type of said second conductivity type;
   a junction formed between said first semiconductor layer and said second semiconductor layer;
   a first depletion layer formed at the junction;
   means for exerting a first electric field strength so as to make a first avalanche multiplication occur in said first depletion layer;
   a third semiconductor layer having a third conductivity type which is the same conductivity type as the second conductivity type, said third conductivity having a second impurity density which is lower than the first impurity density of said second semiconductor layer surrounding a peripheral area outside of said junction,
   a second depletion layer formed between said first and third semiconductor layers and
   means for exerting a second electric field strength in said second depletion layer which is set below a field strength which causes a second avalanche multiplication in said second depletion layer,
   wherein each one of said plurality of photosites has respectively different depths of avalanche multiplication regions formed in at least one of said semiconductor layers, so that the first avalanche multiplication in the first depletion layer of each one of said plurality of photosites occurs selectively for a particular light frequency.

5. A solid state imager as described in claim 1, further comprising a plurality of photosites, each one of said plurality of photosites having respectively different depths of avalanche multiplication regions formed in at least one of said semiconductor layers, so that the first avalanche multiplication in the first depletion layer of each one of said plurality of photosites occurs selectively for a particular light frequency.

6. A driving method of the solid state imager as described in claim 1, wherein an arbitrary period of time during which a voltage is being applied on one of the transparent electrode and the poly-silicon electrode is set within a charge storage time to control an average multiplication gain during said charge storage time.

7. A solid state imager as described in claim 1, further including a readout electrode for reading out signal charges and wherein one of the transparent electrode and the poly-silicon electrode is disposed apart from said readout electrode.

8. A driving method of the solid state imager as described in claim 1, wherein in a multiplication time a voltage having a first polarity is applied on one of the transparent electrode and the poly-silicon electrode to make the first avalanche multiplication occur in said photosite, while in a readout time a voltage having a second polarity is applied thereon, said first polarity is a reverse polarity of said second polarity.

9. A solid state imager as described in claim 1, wherein said photosite has a first junction plane positioned in said junction and wherein an opening is provided in a light screen material laminated over said photosite, and a convex transparent resin is placed thereabove so that an incident light through said convex transparent resin is collected in said first junction plane of said photosite.

10. A solid state imager as described in claim 1, wherein said photosite has a first junction plane positioned in said junction and wherein one of the transparent electrode and the polysilicon electrode is convex shaped and positioned above said first junction plane located in said photosite.

11. A solid state imager as described in claim 9, wherein at least one side plane of trenches is provided enclosing said photosite, and a side light screen material is deposited into said trenches.

12. A solid state imager as described in claim 10, wherein at least one side plane of trenches is provided enclosing said photosite, and a light screen material is deposited into said trenches.

13. A solid state imager for reading out charges comprising:
 a photosite, including
 a first semiconductor layer having a first conductivity type;
 a second semiconductor layer having a second conductivity type with a first impurity density, said second semiconductor layer having a smaller area than said first semiconductor layer, said first conductivity type is the opposite conductivity type of said second conductivity type;
 a junction formed between said first semiconductor layer and said second semiconductor layer;
 a first depletion layer formed at the junction;
 means for exerting a first electric field strength so as to make a first avalanche multiplication occur in said first depletion layer;
 a third semiconductor layer having a third conductivity type which is the same conductivity type as the second conductivity type, said third conductivity having a second impurity density which is lower than the first impurity density of said second semiconductor layer surrounding a peripheral area outside of said junction,
 a second depletion layer formed between said first and third semiconductor layers and
 means for exerting a second electric field strength in said second depletion layer which is set below a field strength which causes a second avalanche multiplication in said second depletion layer,
 wherein at least one side plane of trenches is provided enclosing said photosite, and a light screen material is deposited into said trenches and said photosite has at least one other side plane trench and a charge transfer means provided in said at least one other side plane trench.

14. A solid state imager as described in claim 11, wherein said photosite has at least one other side plane trench and a charge transfer means provided in said at least one other side plane trench.

15. A solid state imager as described in claim 12, wherein said photosite has at least one other side plane trench and a charge transfer means provided in said at least one other side plane trench.

16. A solid state imager for reading out charges comprising:
 a photosite, including
 a first semiconductor layer having a first conductivity type;
 a second semiconductor layer having a second conductivity type with a first impurity density, said second semiconductor layer having a smaller area than said first semiconductor layer, said first conductivity type is the opposite conductivity type of said second conductivity type;
 a junction formed between said first semiconductor layer and said second semiconductor layer;
 a first depletion layer formed at the junction;
 means for exerting a first electric field strength so as to make a first avalanche multiplication occur in said first depletion layer;
 a third semiconductor layer having a third conductivity type which is the same conductivity type as the second conductivity type, said third conductivity having a second impurity density which is lower than the first impurity density of said second semiconductor layer surrounding a peripheral area outside of said junction,
 a second depletion layer formed between said first and third semiconductor layers and
 means for exerting a second electric field strength in said second depletion layer which is set below a field strength which causes a second avalanche multiplication in said second depletion layer,
 wherein at least one side plane of trenches is provided enclosing said photosite, and a light screen material is deposited into said trenches and said photosite has at least one other side plane trench and a conducting material for transferring charges provided in said at least one other side plane trench.

17. A solid state imager as described in claim 11, wherein said photosite has at least one other side plane trench and a conducting material for transferring charges provided in said at least one other side plane trench.

18. A solid state imager as described in claim 12, wherein said photosite has at least one other side plane trench and a conducting material for transferring charges provided in said at least one other side plane trench.

19. A solid state imager for reading out charges comprising:
 a photosite, including
 a first semiconductor layer having a first conductivity type;
 a second semiconductor layer having a second conductivity type with a first impurity density, said second semiconductor layer having a smaller area than said first semiconductor layer, said first conductivity type is the opposite conductivity type of said second conductivity type;

a junction formed between said first semiconductor layer and said second semiconductor layer;

a first depletion layer formed at the junction;

means for exerting a first electric field strength so as to make a first avalanche multiplication occur in said first depletion layer;

a third semiconductor layer having a third conductivity type which is the same conductivity type as the second conductivity type, said third conductivity having a second impurity density which is lower than the first impurity density of said second semiconductor layer surrounding a peripheral area outside of said junction, a second depletion layer formed between said first and third semiconductor layers and means for exerting a second electric field strength in said second depletion layer which is set below a field strength which causes a second avalanche multiplication in said second depletion layer, wherein the photosite has an average avalanche gain and wherein the means for reading out charges includes means for applying a first voltage pattern to the photosite; and means for applying a second voltage pattern having a multiplication time period to a gate located directly above the photosite so that said average avalanche gain is controlled by varying said multiplication time period.

20. A solid state imager for reading out charges comprising:

first and second photosites, each of said photosites including a first semiconductor layer having a first conductivity type;

a second semiconductor layer having a second conductivity type with a first impurity density, said second semiconductor layer having a smaller area than said first semiconductor layer, said first conductivity type is the opposite conductivity type of said second conductivity type;

a junction formed between said first semiconductor layer and said second semiconductor layer;

a first depletion layer formed at the junction;

means for exerting a first electric field strength so as to make a first avalanche multiplication occur in said first depletion layer;

a third semiconductor layer having a third conductivity type which is the same conductivity as the second conductivity type, said third conductivity having a second impurity density which is lower than the first impurity density of said second semiconductor layer surrounding a peripheral area outside of said junction, a second depletion layer formed between said first and third semiconductor layers and means for exerting a second electric field strength in said second depletion layer which is set below a field strength which causes a second avalanche multiplication in said second depletion layer, wherein in said first photosite, an impurity profile is formed in at least one of said semiconductor layers, said impurity profile is shaped so that an avalanche multiplication region in the first depletion layer is formed at a depth in said first photosite so that the first avalanche multiplication in the first depletion layer occurs selectively for a first particular single color, and in said second photosite, an impurity profile is formed in at least one of said semiconductor layers, said impurity profile is shaped so that an avalanche multiplication region in the first depletion layer is formed at a depth in said second photosite so that the first avalanche multiplication in the first depletion layer occurs selectively for a second particular single color which is different from said first particular color.

21. A solid state imager as described in claim 20, further comprising a third photosite, wherein in said third photosite, an impurity profile is formed in at least one of said semiconductor layers, said impurity profile is shaped so that an avalanche multiplication region in the first depletion layer is formed at a depth in said first photosite so that the first avalanche multiplication in the first depletion layer occurs selectively for a third particular single color which is different from said first or second particular color.

* * * * *